(12) United States Patent
Matloubian et al.

(10) Patent No.: US 6,232,624 B1
(45) Date of Patent: May 15, 2001

(54) INPSB CHANNEL HEMT ON INP FOR RF APPLICATION

(75) Inventors: Mehran Matloubian, Encino; Daniel Docter, Santa Monica; Miroslav Micovic, Newbury Park, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/351,809

(22) Filed: Jul. 12, 1999

(51) Int. Cl.$^7$ .............................................. H01L 31/0328
(52) U.S. Cl. ................................................... 257/194
(58) Field of Search ............................................. 257/194

(56) References Cited

U.S. PATENT DOCUMENTS

| | | |
|---|---|---|
| 5,184,106 | 2/1993 | Partin et al. . |
| 5,548,140 | 8/1996 | Nguyen et al. . |
| 5,721,161 | 2/1998 | Nguyen et al. . |
| 5,798,540 | * 8/1998 | Boos et al. ............................ 257/194 |

FOREIGN PATENT DOCUMENTS

| | | |
|---|---|---|
| 3241840 | * 10/1991 | (JP) . |
| 03-241840 | 1/1992 | (JP) . |

OTHER PUBLICATIONS

Stein et al., "Room temperature InPSb/InAs and InPSb.InAsSb mid–infrared emitting diodes grown by MOVPE" IEE Proc.–Optoelectronics V4145 p 257–260, Oct. 1998.*

Bolognesi, C.R., et al. "High–Transconductance Delta–Doped InAs/A1Sb HFET's with Ultrathin Silicon–Doped InAs Quantum Well Donor Layer" IEEE Electron Device Letters (Mar. 1998), vol. 19, No. 3, pp–83–85.

Matloubian, M., et al. "20–GHz High–Efficiency A1InAs–GaInAs on InP Power HEMT" IEEE Microwave and Guided Wave Letters (May 1993) vol. 3, No. 5, pp. 142–144.

Nguyen, L.D., et al. "Millimeter Wave InP HEMT Technology: Performance and Applications" Solid–State Electronics (1995) vol. 38, No. 9, pp. 1575–1579.

Von Eichel–Streiber, et al. "Doping of InAs, GaSb and InPSb by low pressure MOVPE", 1977 *Journal of Crystal Growth 170*, pp. 783–787.

* cited by examiner

Primary Examiner—Olik Chaudhuri
Assistant Examiner—Douglas A. Wille
(74) Attorney, Agent, or Firm—T. Gudmestad

(57) ABSTRACT

A high electron mobility transistor (HEMT) includes a substrate comprising indium phosphide and an optional buffer layer immediately adjacent the substrate. A channel layer immediately is adjacent the buffer layer, with the channel layer comprising indium phosphide antimonide and characterized by a formula of $InP_xSb_{(1-x)}$, wherein x is about 0.85. The channel layer has a thickness of about 120 Angstroms. A Schottky layer is immediately adjacent the channel layer and a contact layer is immediately adjacent the Schottky layer. The transistor is characterized by a breakdown field of about 400 kV/cm and a saturated velocity of about $8.2 \times 10^6$ cm/s.

23 Claims, 1 Drawing Sheet

INPSB CHANNEL HEMT ON INP FOR RF APPLICATION

BACKGROUND OF THE INVENTION

1. Field of the Invention

The present invention generally relates to high electron mobility transistors (HEMT) and, more particularly, to InP based HEMT that have an improved channel for increased performance.

2. Description of Related Art

High electron mobility transistors (HEMT) are used for microwave and millimeter low noise amplifiers, as well as other RF applications. Those components have been used for various environments such as radar, satellites, and cellular telephones. In millimeter wave communications, the focus has been on GaAs pseudomorphic HEMT and InP HEMT.

Most of the interest in the above two HEMT has been on GaAs. For example, Bolognesi et al., "High-Transconductance Delta-Doped InAs/AlSb HFET's with Ultrathin Silicon-Doped InAs Quantum Well Donor Layer," IEEE Electron Device Letters, Vol. 19, No. 3, pp. 83–85, March 1998 describe an InAs channel layer sandwiched between two AlSb spacer layers. They point out that silicon, which is the usual donor in molecular beam epitaxy (MBE), displays amphoteric behavior in antimonide compounds. Therefore, chalcogenide compounds have been developed for doping, but which have their own disadvantages, such as DX-centers and residual contamination. In an attempt to avoid the disadvantages of chalcogenide compounds, Bolognesi et al. utilized an ultrathin silicon doped InAs quantum well. They believed that doing so produced high transconductance and good channel pinch-off characteristics.

Notwithstanding the fact that GaAs has been the focus of past interest, there has been increasing interest in InP. For an InP substrate, an InGaAs channel has historically always been used. The InGaAs channel has been perceived as having excellent transport properties, providing significant current drive, and having a sufficiently large conduction band discontinuity with InAlAs (the common Schottky material). In growing the InGaAs channel, it has usually been lattice matched to the substrate and made indium rich to increase the conduction band discontinuity and improve transport properties. But doing so has been at the expense of degrading breakdown performance.

An example of an InP substrate with an InGaAs channel is found in Nguyen et al. "Millimeter Wave InP HEMT Technology: Performance and Applications," Solid-State Electronics, Vol. 38, No. 9, pp 1575–1579, 1995. They describe their InP HEMT with particular reference to gain and noise characteristics. Among other things, Nguyen et al. found that their InP HEMT exhibited lower noise and higher gain in comparison to a GaAs pseudomorphic HEMT. However, their InP HEMT exhibited a lower breakdown voltage.

In another example of an InP HEMT with a InGaAs channel, Matloubian et al., "20-GHz High-Efficiency AlInAs—GaInAs on InP Power HEMT," IEEE Microwave and Guided Wave Letters, Vol. 3, No. 5, pp142–144, May 1993 describe their channel layer as being sandwiched between two spacer layers of AlInAs. They indicate that the large conduction band discontinuity, high channel mobility, and high peak velocity in GaInAs result in high transconductance, low parasitic resistances, and excellent high-frequency performance. At 20-GHz, Matloubian et al. believed that their combination of output power, power density, gain and efficiency was comparable to the best results reported for InGaAs on GaAs HEMT.

It can be seen that performance comparisons have focused on a variety of characteristics. Some of them have included breakdown field, energy bandgap, low field mobility, saturated velocity, peak velocity, electric field and thermal conductivity. However, increased performance in one characteristic sometimes leads to a reduction in another characteristic. And even with its advantages, some of the specific disadvantages of the InGaAs channel include the fact that it is narrow in energy bandgap which, in turn, creates a rather low three terminal breakdown voltage. It is also affected by impact ionization and Auger recombination processes. Hence, the building of RF power devices using an InGaAs channel HEMT is restrictive.

Accordingly, there is a need for an improved InP HEMT for RF applications. There is also a need for a channel layer in an InP HEMT that leads to increased performance. The increased performance characteristics that are needed for an InP HEMT include breakdown field, energy bandgap, saturated velocity, peak velocity, electric field and thermal conductivity. Also needed is an improved InP HEMT that can achieve increased performance while also allowing room for adaptability.

SUMMARY OF THE INVENTION

The present invention is directed to an improved InP HEMT, particularly for RF applications. More specifically, the present invention improves the performance over that achieved by an InP HEMT using an InGaAs channel. In particular, an InPSb channel layer is used and which can optionally be strained.

The high electron mobility transistor according to one embodiment of the present invention includes a substrate comprising indium phosphide; a channel layer interfacing the substrate, with the channel layer comprising indium phosphide antimonide; a Schottky layer interfacing the channel layer; and a contact layer interfacing the Schottky layer.

In another embodiment of the present invention, the HEMT includes a substrate comprising indium phosphide; a buffer layer immediately adjacent the substrate; a channel layer immediately adjacent the buffer layer, with the channel layer comprising indium phosphide antimonide and characterized by a formula of $InP_xSb_{(1-x)}$, wherein x is about 0.95 to 0.70; a Schottky layer immediately adjacent the channel layer; and a contact layer immediately adjacent the Schottky layer.

These and other features, aspects and advantages of the present invention will become better understood with reference to the following drawings, description, and claims.

DESCRIPTION OF THE PREFERRED EMBODIMENTS

Figure 1:
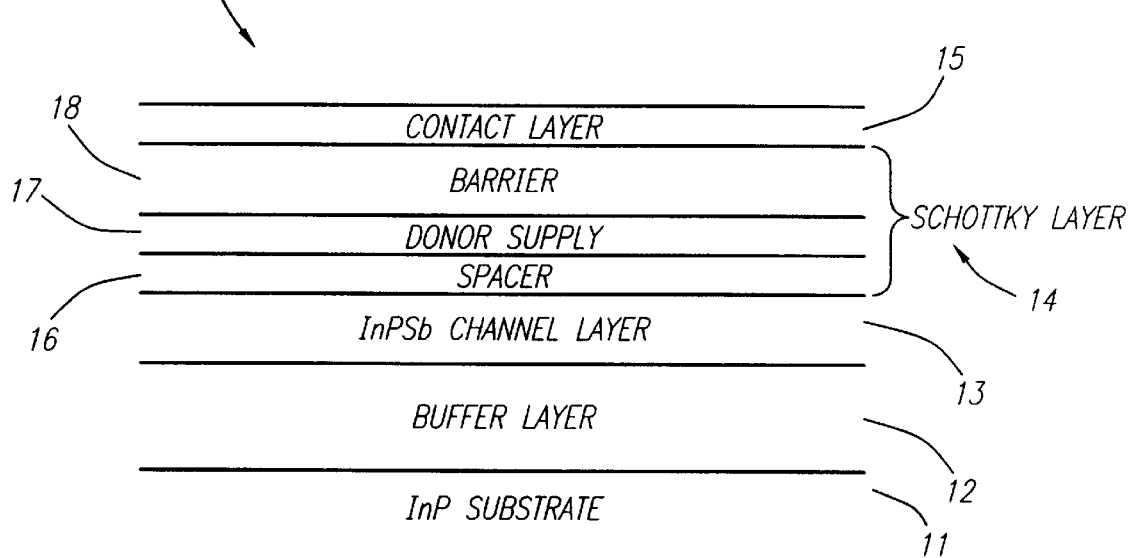
FIG. 1 is a schematic, cross-sectional diagram of a HEMT according to an embodiment of the present invention.

FIG. 1 schematically depicts an InP HEMT 10 according to an embodiment of the present invention. While the HEMT 10 may have particular benefit in the context of RF applications, the present invention is not so limited. Further, and as with HEMT in general, the present invention can be made by well known methods of growing semiconductor layers, such as metal organic vapor deposition epitaxy (MOVPE) and molecular beam epitaxy (MBE). In accordance with such well known methods, it can be appreciated that in growing the semiconductor layers in the present invention, the specific compounds and their concentrations can vary while remaining within the scope of the present invention.

As shown in FIG. 1, the HEMT 10 includes a substrate 11. The semiconductor layers of the HEMT include an optional buffer layer 12, a channel layer 13, a Schottky layer 14, and a contact layer 15. The general structures and functions of those semiconductor layers are well known in the art and described, for example, in J. B. Stringfellow, Organometallic Vapor-Phase Epitaxy, Academic Press (1989).

In this embodiment, the substrate 11 is made of indium phosphide and can be in the form of a commercially available material. Usefully, the substrate 11 is about 400 to 700 microns thick, and preferably about 550 microns thick.

Immediately adjacent to the substrate 11 is the optional buffer layer 12. The buffer layer 12 is intended to shield the conducting or channel layer 13 from the electrical effects of the substrate 11. The buffer layer 12 can, if desired, also provide a smooth growth front between the substrate 11 and the channel layer 13. Thus, the buffer layer 12 can be lattice matched or lattice mismatched to the substrate 11. The term "lattice matched" is intended to refer to a layer that has the same natural lattice constant as that of the substrate. On the other hand, the term "lattice mismatched" is intended to refer to a layer which has a different natural lattice constant from that of the substrate. Furthermore, this embodiment depicts the buffer layer 12 as a single layer. Yet, the present invention contemplates that the buffer layer 12 can be made of a plurality of sub-layers. The buffer layer 12, in this embodiment, is made of undoped InAlAs and with a thickness from about 100 to 5000 Angstroms. Preferably, its thickness is about 2500 Angstroms.

In this preferred embodiment of the invention, as shown in FIG. 1, the buffer layer 12 directly interfaces with the channel layer 13 that supports electron flow or conduction. In this embodiment, the channel layer 13 is made of undoped indium phosphide antimonide. The indium phosphide antimonide is characterized by a formula $InP_xSb_{(1-x)}$, wherein x is preferably from about 0.95 to 0.70. More preferably, x is about 0.85.

The use of indium phosphide antimonide as the channel layer 13 material is contrary to the prevailing teaching of using InGaAs, as described above. Indeed, the use of antimony is also contrary to the prevailing teaching due to its perceived disadvantages, as described by Bolognesi et al. noted above. A likely reason for the historical combination of InGaAs with an InP substrate may be the relative availability of the precursor source materials for indium, gallium, and arsenic. Another reason may be the relative ease in deposition of high quality films involving indium, gallium, and/or arsenic. In comparison to InAs, GaAs, and ternary compounds thereof, a material such as InSb has a greater dissimilarity in energy bandgap and lattice constant vis-à-vis InP, which would seem to dictate that those materials not be as favorably combined. Nevertheless, InPSb ternary compounds have been deposited on GaSb and InAs substrates. In those instances, the relative concentrations of phosphorous to antimony has been weighted in favor of the antimony. Still, InPSb has generally been disfavored because of the high cost of antimony and the perception that the ease of manufacturing is not as good as other channel materials made by molecular beam epitaxy (MBE).

In any event, the channel layer 13 of the present invention can be in a "strained" or "non-strained condition." What is meant by the term "strained" in this context is the presence of compressive forces which constrain the lateral lattice constant of the channel 13 to that of the buffer layer 12, and modify the vertical lattice constant to accommodate the strain energy. Thus, if the optional buffer layer 12 is present, as shown in FIG. 1, but is not lattice matched to the substrate 11, the channel layer 13 may be non-strained. If the optional buffer layer 12 is present and is lattice matched to the substrate 11, then the channel layer 13 will be strained. And if the buffer layer 11 is not present, the channel layer 13 will be strained.

The channel layer 13 thickness is dependent upon the concentration of the antimony. In general, as the antimony concentration increases, the layer 13 thickness decreases. Given the above preferred concentration range for antimony, the channel layer 13 is preferably about 30 to 280 Angstroms thick, although a greater range is contemplated by the present invention. More preferably, the thickness is about 120 Angstroms. The channel layer is preferably undoped.

The Schottky layer 14 includes a spacer layer 16, a donor layer 17, and a barrier layer 18. The spacer layer 16 can provide separation between the channel layer 13 and the donor layer 17 which can act as a scattering mechanism for electron conduction. With indium phosphide antimonide as the channel 13 material, the spacer layer 16 can be made of materials such as undoped InP, InAlAs, InAlAsSb, GaPSb, AlPSb, AlGaPSb, AlAsSb, or AlGaAsSb. As the source of electrons, the donor layer 17 can be made of materials such as doped InP, InAlAs, InAlAsSb, GaPSb, AlPSb, AlGaPSb, AlAsSb, or AlGaAsSb. The dopants can vary and include Si, Te, Sn, Se, S, or Ge. The dopant concentration can also vary, such as from about $5E17$ $cm^{-3}$ to $5E19$ $cm^{-3}$. The barrier layer 18 provides a wider energy bandgap barrier to support a better Schottky gate contact. With materials for the other layers described above, the barrier layer can be made of undoped InP, InAlAs, InAlAsSb, GaPSb, AlPSb, AlGaPSb, AlAsSb, or AlGaAsSb. For this embodiment, the thickness of the Schottky layer 14 ranges from about 50 to 700 Angstroms and is preferably about 300 Angstroms. The spacer layer 16 can then be about 0 to 100 Angstroms thick; the donor layer 17 can then be about 0 to 100 Angstroms thick; and the barrier layer 18 can be about 50 to 500 Angstroms thick.

The contact layer 15 provides a contact area for the source and drain (not shown) and can be made of various materials, such as doped InGaAs, InAs, InSb, or InGaAsSb. The dopants can vary and include Si, Te, Sn, Se, S, or Ge. The dopant concentration can also vary, such as from about $5E17$ $cm^{-3}$ to $5E19$ $cm^{-3}$. For this embodiment, the thickness of the contact layer 15 ranges from about 50 to 200 Angstroms and is preferably about 75 Angstroms.

Figure 2:
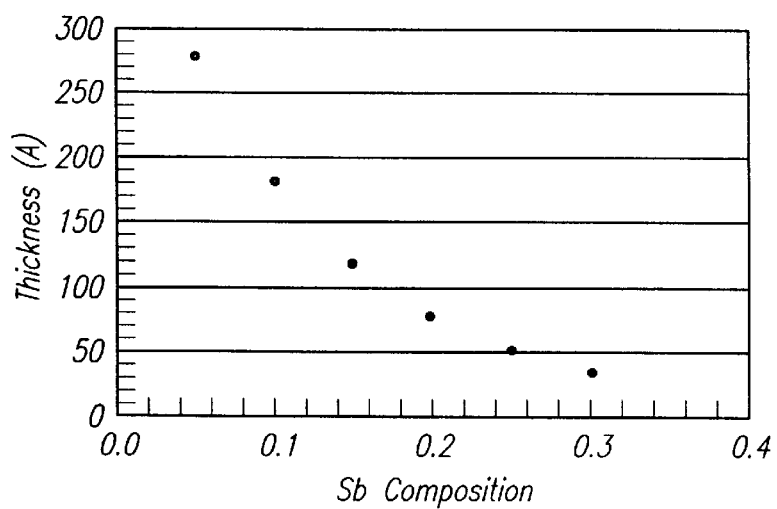
FIG. 2 is a graph depicting channel layer thickness versus antimony concentration according to an embodiment of the present invention.

With the above preferred embodiment, the channel layer 13 was made of $InP_xSb_{(1-x)}$, x ranged from about 0.95 to 0.7, and the channel layer thickness ranged from about 30 to 280 Angstroms thick, as graphically shown in FIG. 2. Critical layer 13 thickness and maximum allowable layer 13 thickness for a given amount of strain was approximately calculated according to the Matthews-Blakeslee formulism. The Matthews-Blakeslee formulism is recognized as a very conservative measure of critical layer thickness, and strained layers exceeding the Matthews-Blakeslee values have been achieved as shown in Table 1 below.

TABLE 1

| % Sb | $t_c$ |
|------|-------|
| 0.05 | 277.6468 |
| 0.1  | 182.0297 |
| 0.15 | 119.3416 |
| 0.2  | 78.24226 |
| 0.25 | 51.29688 |
| 0.3  | 33.63106 |

When the channel layer 13 was specifically made of $InP_{0.85}Sb_{0.15}$ at about 120 Angstroms thick, the following characteristics were calculated from linear extrapolations based on the known properties of the end binary compound InP and InSb and compared with a channel layer comprising $In_{0.53}Ga_{0.47}As$. The differences are shown below in Table 2.

TABLE 2

| | $In_{.53}Ga_{.47}As$ | $InP_{.85}Sb_{.15}$ |
|---|---|---|
| $E_g$ energy bandgap | 0.76 eV | 1.174 eV |
| Breakdown Field | ~100 kV/cm | ~400 kV/cm |
| $\mu$ low field mobility | 21,250 cm$^2$/Vs | 16,250 cm$^2$/Vs |
| $V_{sat}$ saturated velocity | 6.2E6 cm/s | 8.2E6 cm/s |
| $V_p$ peak velocity | 2.4E7 cm/s | 2.8E7 cm/s |
| Electric field @ $V_p$ | 4 kV/cm | 12 kV/cm |
| Thermal Conductivity | 0.048 W/cm° K. | 0.085 W/cm° K. |

As can be appreciated by those skilled in the art, the present invention provides an improved InP HEMT, particularly for RF applications. There is also provided a channel layer in an InP HEMT that leads to increased performance.

The increased performance characteristics include breakdown field, energy bandgap, saturated velocity, peak velocity, electric field and thermal conductivity. Also provided by the present invention is an improved InP HEMT that can achieve increased performance while also allowing room for adaptability.

It should be understood, of course, that the foregoing relates to preferred embodiments of the invention and that modifications may be made without departing from the spirit and scope of the invention as set forth in the following claims.

What is claimed is:

1. A high electron mobility transistor, comprising:
   a substrate comprising indium phosphide;
   a channel layer interfacing said substrate, said channel layer comprising indium phosphide antimonide;
   a Schottky layer interfacing said channel layer; and
   a contact layer interfacing said Schottky layer.

2. The transistor of claim 1, further comprising a buffer layer intermediate said substrate and channel layer.

3. The transistor of claim 1, wherein said channel layer is characterized as being strained.

4. The transistor of claim 1, wherein said indium phosphide antimonide is characterized by a formula of $InP_xSb_{(1-x)}$, wherein x is about 0.95 to 0.70.

5. The transistor of claim 1, wherein said channel layer has a thickness of about 30 to 280 Angstroms.

6. A high electron mobility transistor, comprising:
   a substrate comprising indium phosphide;
   a channel layer interfacing said substrate, said channel layer comprising indium phosphide antimonide and having a thickness between about 30 to 280 Angstroms;
   a Schottky layer interfacing said channel layer; and
   a contact layer interfacing said Schottky layer.

7. The transistor of claim 6, further comprising a buffer layer intermediate said substrate and channel layer.

8. The transistor of claim 6, wherein said channel layer thickness is about 120 Angstroms.

9. The transistor of claim 6, wherein said channel layer is strained.

10. The transistor of claim 6, wherein said indium phosphide antimonide is characterized by a formula of $InP_xSb_{(1-x)}$, wherein x is about 0.95 to 0.70.

11. The transistor of claim 10, wherein x is about 0.85.

12. A high electron mobility transistor, comprising:
   a substrate comprising indium phosphide;
   a buffer layer immediately adjacent said substrate;
   a channel layer immediately adjacent said buffer layer, said channel layer comprising indium phosphide antimonide and characterized by a formula of $InP_xSb_{(1-x)}$, wherein x is about 0.95 to 0.70;
   a Schottky layer immediately adjacent said channel layer; and
   a contact layer immediately adjacent said Schottky layer.

13. The transistor of claim 12, wherein said buffer layer is lattice matched to said substrate.

14. The transistor of claim 12, wherein said buffer layer is lattice mismatched to said substrate.

15. The transistor of claim 12, wherein x is about 0.85.

16. The transistor of claim 12, wherein said channel layer has a thickness of about 30 to 280 Angstroms.

17. The transistor of claim 16, wherein said thickness is about 120 Angstroms.

18. A high electron mobility transistor, comprising:
   a substrate comprising indium phosphide;
   a buffer layer immediately adjacent said substrate;
   a channel layer immediately adjacent said buffer layer, said channel layer comprising indium phosphide antimonide and characterized by a formula of $InP_xSb_{(1-x)}$, wherein x is about 0.85, said channel layer having a thickness of about 120 Angstroms;
   a Schottky layer immediately adjacent said channel layer; and
   a contact layer immediately adjacent said Schottky layer,
   whereby said transistor is characterized by a breakdown field of about 400 kV/cm and a saturated velocity of about $8.2 \times 10^6$ cm/s.

19. The transistor of claim 18, wherein the transistor is further characterized by a peak velocity of about $2.8 \times 10^7$ cm/s.

20. The transistor of claim 18, wherein the transistor is further characterized by a low field mobility of about 16,250 cm$^2$/Vs.

21. The transistor of claim 18, wherein the transistor is further characterized by a thermal conductivity of about 0.085 W/cm/K.

22. The transistor of claim 18, wherein the transistor is further characterized by an electric field at peak velocity of about 12 kV/cm.

23. The transistor of claim 18, wherein the transistor is further characterized by an energy bandgap of about 1.174 eV.

* * * * *